US006611167B2

(12) United States Patent
McMahon et al.

(10) Patent No.: US 6,611,167 B2
(45) Date of Patent: Aug. 26, 2003

(54) BALANCED BI-DIRECTIONAL CURRENT SOURCE

(75) Inventors: Terrence A. McMahon, Hudson, WI (US); Ray V. Rigles, Bloomington, MN (US); David M. Gray, Bloomington, MN (US); William P. Wood, Waconia, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/252,238

(22) Filed: Sep. 23, 2002

(65) Prior Publication Data

US 2003/0016077 A1 Jan. 23, 2003

Related U.S. Application Data

(63) Continuation of application No. 09/784,782, filed on Feb. 15, 2001.
(60) Provisional application No. 60/182,826, filed on Feb. 16, 2000.

(51) Int. Cl.$^7$ ................................................. G05F 3/02
(52) U.S. Cl. ...................... 327/538; 323/316; 360/75; 318/432; 318/433; 318/678; 318/801
(58) Field of Search .............................. 327/50, 51, 110, 327/112, 538; 323/282, 316, 315; 318/135, 109, 432, 433, 459, 494, 512, 533, 534, 537, 678, 801, 803; 330/85, 105; 360/78.05, 75

(56) References Cited

U.S. PATENT DOCUMENTS

| | | | | |
|---|---|---|---|---|
| 3,681,699 A | * | 8/1972 | Kelly et al. ................. 327/334 |
| 4,472,608 A | * | 9/1984 | Beirne .................... 379/399.01 |
| 4,737,696 A | * | 4/1988 | Yokogawa et al. ......... 318/135 |
| 4,922,160 A | * | 5/1990 | Ogawa ........................ 318/135 |
| 5,266,887 A | * | 11/1993 | Smith ........................ 323/316 |
| 5,315,231 A | * | 5/1994 | Linder et al. ............... 323/315 |
| 5,734,293 A | * | 3/1998 | Gross ......................... 327/561 |
| 5,747,952 A | * | 5/1998 | Izawa et al. ................ 318/135 |
| 5,781,068 A | * | 7/1998 | Takita ......................... 330/85 |
| 6,204,629 B1 | * | 3/2001 | Rote et al. .................. 318/803 |
| 6,215,290 B1 | * | 4/2001 | Yang et al. ................. 323/282 |
| 6,249,890 B1 | | 6/2001 | Ukani et al. ................ 714/721 |
| 6,363,214 B1 | * | 3/2002 | Merello et al. ............. 318/109 |
| 6,373,650 B1 | * | 4/2002 | Pedrazzini .................... 360/75 |
| 6,392,375 B1 | * | 5/2002 | Portaluri et al. ............ 318/459 |
| 6,501,255 B2 | * | 12/2002 | Pomeroy .................... 323/312 |

OTHER PUBLICATIONS

Malvino, Albert, 1973 "Electronic Principles", McGraw–Hill, Third Edition pp. 353 & 454.

* cited by examiner

*Primary Examiner*—Terry D. Cunningham
(74) *Attorney, Agent, or Firm*—Westman, Champlin & Kelly (57) ABSTRACT

A balanced bi-directional current source is provided, which includes first and second current output terminals, a current control circuit, first and second amplifiers and first and second sense impedances. The current control circuit has a reference input, a feedback input, and a control output, which is based on the reference input and the feedback input. The first amplifier has a first amplifier input, which is coupled to the control output, and a first amplified output. The second amplifier has a second amplifier input, which is coupled to the control output, and a second amplified output, which is inverted relative to the first amplified output. The first sense impedance is coupled in series between the first amplified output and the first current output terminal and has a feedback output which is coupled to the feedback input. The second sense impedance is matched with the first impedance and is coupled in series between the second amplified output and the second current output terminal.

14 Claims, 5 Drawing Sheets

BALANCED BI-DIRECTIONAL CURRENT SOURCE

CROSS-REFERENCE TO RELATED APPLICATION

This application is a continuation of U.S. application Ser. No. 09/784,782, filed Feb. 15, 2001 and entitled "A TRASFER CURVE TESTER FOR TESTING MAGNETIC RECORDING HEADS", which claims priority from U.S. Provisional Application No. 60/182,826, filed Feb. 16, 2000, and entitled "HIGH PERFORMANCE TRANSFER CURVE TESTER AND TEMPERATURE COMPENSATED HALL SENSOR."

FIELD OF THE INVENTION

The present invention relates to data storage systems and, more particularly, to a transfer curve tester having a bi-directional current source for testing magnetic recording heads used in data storage systems.

BACKGROUND OF THE INVENTION

Many data storage systems use magnetic or magneto-optical recording heads for writing information to and reading information from a magnetic medium. For example, disc drives of the "Winchester" type have one or more rigid discs, which are coated with a magnetizable medium for storing digital information in a plurality of circular, concentric data tracks. The discs are mounted on a spindle motor, which causes the discs to spin and the surfaces of the discs to pass under respective head suspension assemblies. Head suspension assemblies carry transducers which write information to and read information from the disc surface. An actuator mechanism moves the head suspension assemblies from track-to-track across the surfaces of the discs under control of electronic circuitry. "Floppy-type" disc drives use flexible discs, which also have circular, concentric data tracks. For a tape drive, the information is stored along linear tracks on the tape surface.

In these applications, several different types of transducers have been used that rely on magnetic properties for writing to and/or reading from the magnetic medium. For an inductive-type transducer, the direction of current through the transducer is controlled during a write operation to encode magnetic flux reversals on the surface of the medium within the selected data track. When retrieving data from the medium, the inductive transducer is positioned over the data track to sense the flux reversals stored in the data track and generate a read signal based on those flux reversals. In a magnetoresistive type of transducing head, the flux reversals cause a change in the resistance of the head, which is sensed by a detector circuit. Typically, a reference current is passed through the magneto-resistive head and the change in resistance is sensed by measuring changes in the voltage across the head. Other types of detecting circuits can also be used.

In order to understand the basic physics of a magnetic transducing head during development and manufacturing, it is common to test the response of the head to an applied magnetic field. For example, one series of tests is known as "Transfer Curve Testing". To generate a transfer curve for a particular transducing head, the head is placed in a magnetic field (steady state or time varying) and the output signal from the transducing head is measured. The transfer curve is simply a plot of the output signal versus the applied magnetic field, where the field is varied from some negative value to some positive value, which is usually the same magnitude as the negative value. For a magneto-resistive type of head, the output signal consists of a steady state voltage, which is a function of the bias current applied to the head, the bulk resistance of the head and the applied magnetic field. Typical characteristics that can be measured from the transfer curve data include read signal amplitude at maximum field, noise with zero field, noise with applied field, linearity over some range of field, and symmetry. Symmetry is a comparison of the read signal amplitude with a maximum positive field and the read signal amplitude with a maximum negative field.

The rapidly changing technology in magnetic recording heads has created a wide range of operating requirements for the heads as well as a wide range of head performances. For example, reference bias current requirements for a transfer curve tester can vary from tens of micro-Amperes to many tens of milli-Amperes, and the transfer curve tester may require tens of volts to drive the reference current. For magneto-resistive types of heads, the amplitudes of output voltages that must be measured can range from tens of micro-volts to tens of milivolts, while the resistance of the head can range from tens of Ohms to hundreds of Ohms. Also, the steady-state voltage output due to the reference bias current is typically hundreds of millivolts, but can be as large as tens of volts with special devices.

These wide ranges of operating requirements and head performances set very challenging requirements for the measurement electronics. For example, in order to measure the noise of a 50 Ohm head, the noise introduced by the transfer curve tester should be less than 1 nV/√Hz. Bias currents of 10 micro-Amperes require a current source with an accuracy of better than 100 nAmps, and the input bias currents drawn by the measurement electronics should be similar to prevent measurement errors. All of these requirements, when coupled with a potentially large DC bias voltage, present a difficult design challenge for the measurement electronics in the transfer curve tester. Typically one or more of these requirements is substantially compromised.

Thus, a transfer curve tester having improved measurement electronics and an accurate current source is desired.

SUMMARY OF THE INVENTION

One aspect of the present invention is directed to a balanced bi-directional current source is provided, which includes first and second current output terminals, a current control circuit, first and second amplifiers and first and second sense impedances. The current control circuit has a reference input, a feedback input, and a control output, which is based on the reference input and the feedback input. The first amplifier has a first amplifier input, which is coupled to the control output, and a first amplified output. The second amplifier has a second amplifier input, which is coupled to the control output, and a second amplified output, which is inverted relative to the first amplified output. The first sense impedance is coupled in series between the first amplified output and the first current output terminal and has a feedback output which is coupled to the feedback input. The second sense impedance is matched with the first impedance and is coupled in series between the second amplified output and the second current output terminal.

Another aspect of the present invention is directed to a balanced bi-directional current source, which includes first and second current output terminals and current control circuit for generating a control output based on a reference input and a feedback input. A further circuit is provides for generating first and second amplified drive currents based on the control output and delivering the first and second amplified drive currents to the first and second output terminals, respectively, through first and second matched sense impedances, respectively, wherein the second amplified drive current is inverted with respect to the first amplified drive current. A voltage developed across the first sense impedance in response to the first amplified drive current is fed back to the feedback input.

DETAILED DESCRIPTION OF ILLUSTRATIVE EMBODIMENTS

Figure 1:
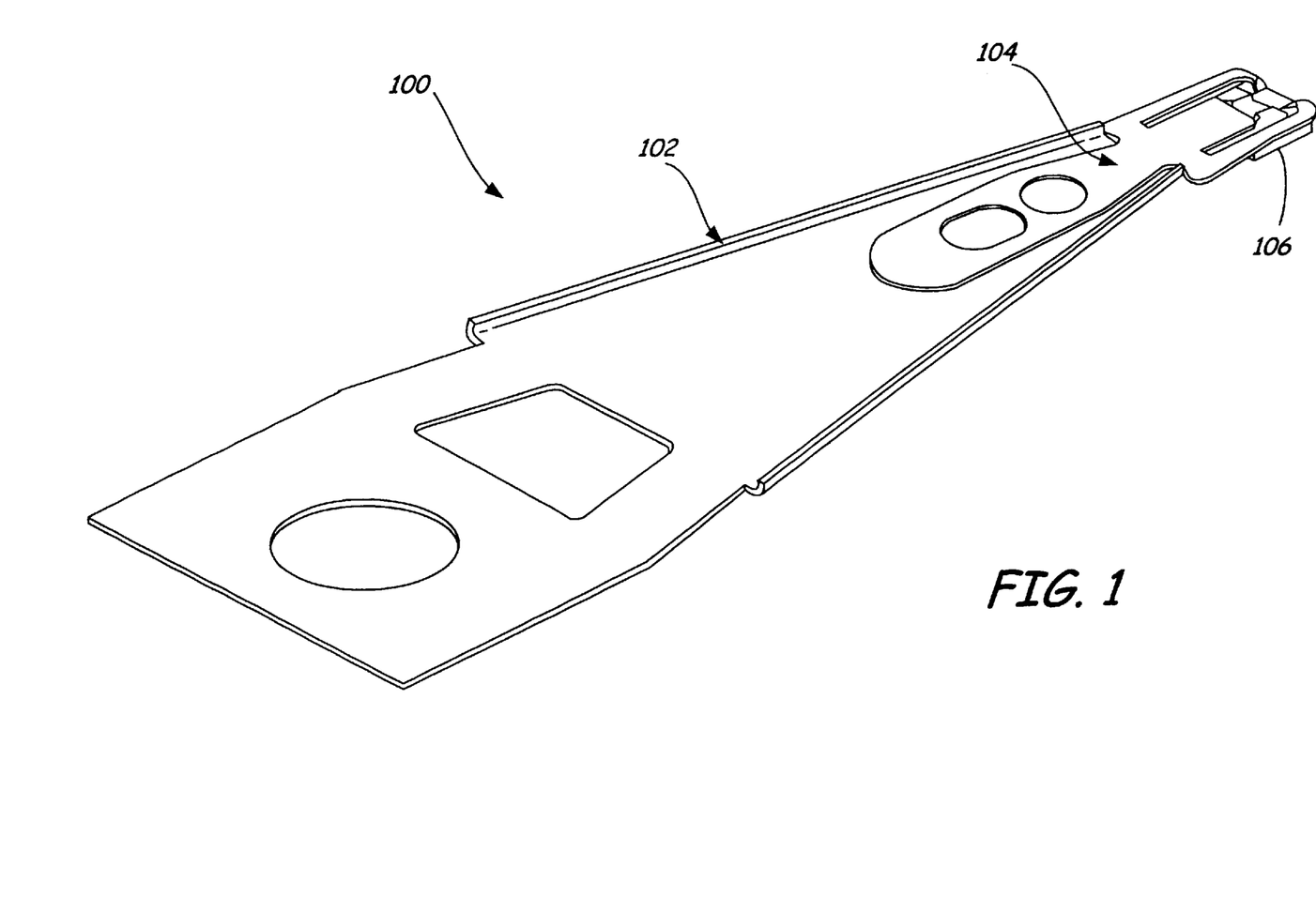
FIG. 1 is a perspective view a typical head suspension assembly for a rigid disc drive.

FIG. 1 is a perspective view of a typical head suspension assembly for a rigid disc drive. Head suspension assembly 100 includes suspension 102, flexure 104 and slider 106. Slider 106 carriers a transducer or "head" for writing to and/or reading from a disc surface in a disc drive. Slider 106 can carry a variety of different types of transducers in alternative embodiments, such as an inductive-type transducer, a magneto-resistive type transducer, a giant magneto-resistive transducer, a spin tunnel junction transducer or a magneto-optical transducer. During operation, suspension 100 is attached to an actuator mechanism (not shown), which moves suspension 100 and the transducer carried by slider 106 from track-to-track across the surface of the disc under control of electronic circuitry.

In order to understand the basic physics of a magnetic recording head during development and manufacturing, it is common to test the response of the head to an applied magnetic field, prior to assembling the head in a drive. For example, one series of tests is known as "Transfer Curve Testing". To generate a transfer curve for a particular recording head, the head is placed in a magnetic field and the output signal from the head is measured. The transfer curve is simply a plot of the output signal versus the applied magnetic field, where the field is varied from some negative value to some positive value, which is usually the same magnitude as the negative value.

Figure 2:
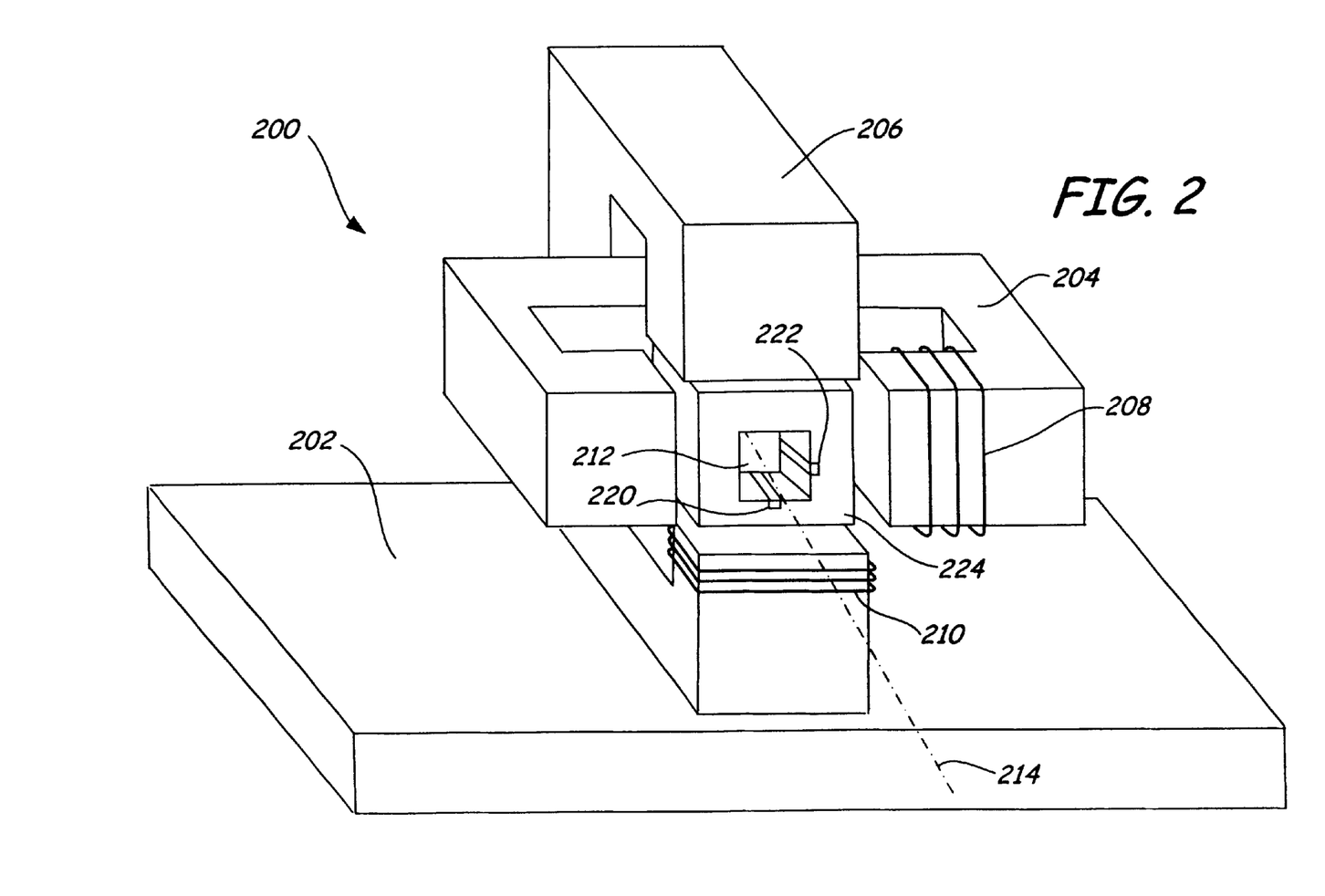
FIG. 2 is a simplified diagram of a head testing apparatus according to one embodiment of the present invention.

FIG. 2 is a simplified diagram of an apparatus for applying a magnetic field to a recording head during transfer curve testing, according to one embodiment of the present invention. The particular testing apparatus shown in FIG. 2 is provided as an example only. It should be understood that any suitable apparatus can be used to generate a magnetic field for testing a magnetic head or other magnetically responsive device in accordance with alternative embodiments of the present invention. Magnetic field generating apparatus 200 includes base 202, magnetic cores 204 and 206, windings 208 and 210 and air gap 212. Cores 204 and 206 are arranged to generate a magnetic field (simple or complex) across air gap 212 in orthogonal directions when excited by windings 208 and 210. Air gap 212 forms a test volume for receiving a magnetic transducer under test. The magnetic transducer is inserted into air gap 212 along axis 214 by a suitable positioning device. In one embodiment, air gap 212 is sized to receive the distal end of a head suspension assembly, such as that shown in FIG. 1, so as to position slider 106 and is attached transducer between opposing faces of cores 204 and 206. However, air gap 212 can be sized to receive a plurality of head suspension assemblies, such as those carried by an E-block actuator assembly in alternative embodiments.

When the head being tested is positioned within air gap 212, windings 208 and 210 are excited to generate a selected magnetic field in air gap 212 according to a predetermined test pattern. The response of the transducer being tested is then measured and analyzed. Hall sensors 220 and 222 are positioned relative to air gap 212 to measure the strength of the magnetic field that is applied across the air gap. In one embodiment, Hall sensors 220 and 222 are supported by a magnetically permeable material 224, which is positioned about air gap 212 between cores 204 and 206. Hall sensor 220 measures the magnetic field generated between the opposing faces of core 204, and Hall sensor 222 measures the magnetic field generated between the opposing faces of core 206.

Figure 3:
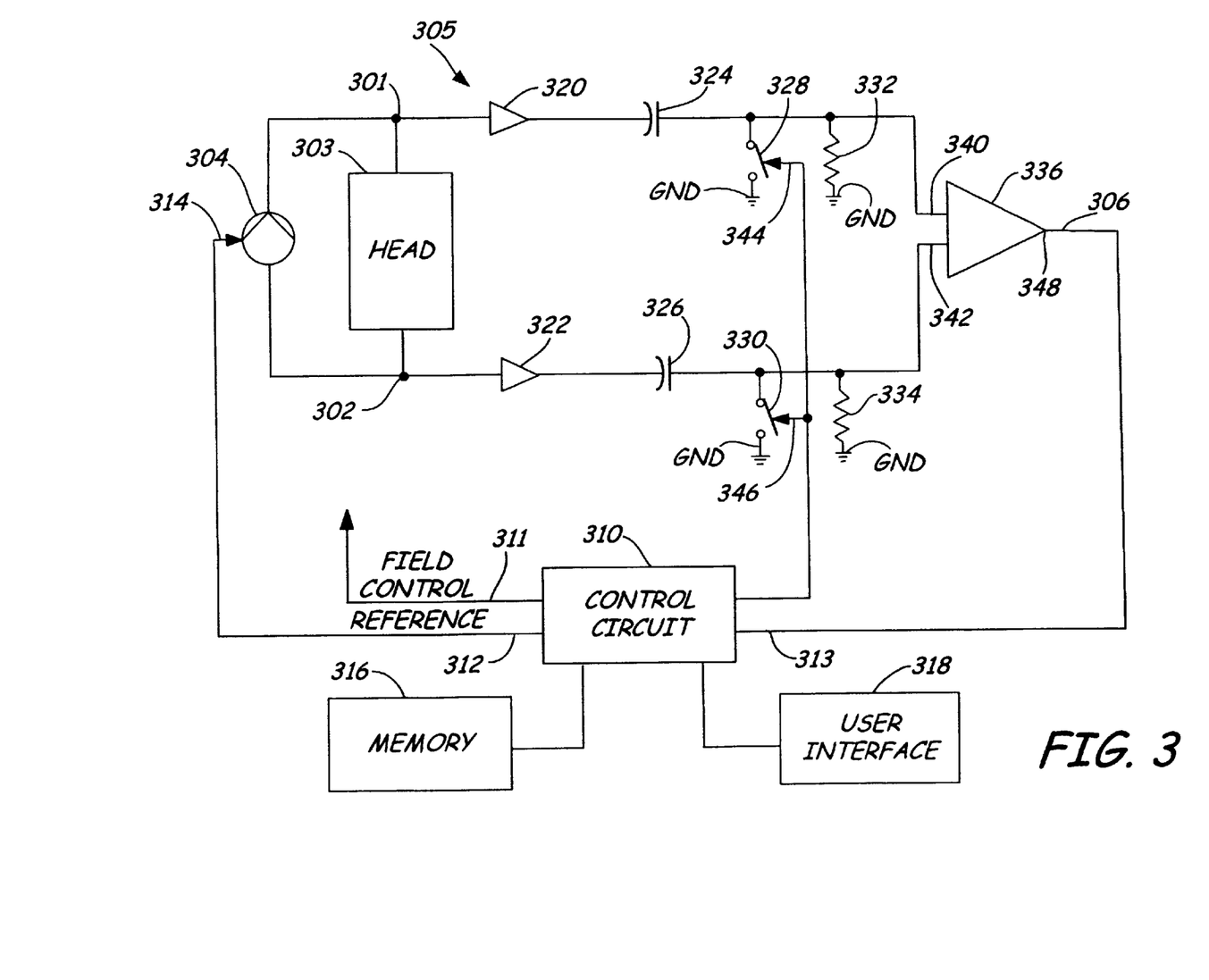
FIG. 3 is a diagram of a head transfer curve tester having a balanced, bi-directional current source and a low-noise measurement circuit according to one embodiment of the present invention.

FIG. 3 is a diagram of a circuit 300 for electrically biasing the recording head and measuring its response to the magnetic field applied by the apparatus shown in FIG. 2, according to one embodiment of the present invention. Circuit 300 includes input terminals 301 and 302 for coupling to a recording head 303 under test. In one embodiment, input terminals 301 and 302 include electrical sockets that are configured for quickly exchanging one recording head 303 for another within circuit 300 as the transfer curve or other characteristics of each recording head is measured.

Circuit 300 further includes a current source 304, which is coupled in parallel with input terminals 301 and 302 for applying a reference bias current, $I_{HEAD}$, to recording head 303. In one embodiment, current source 304 is a balanced, bi-directional current source that is capable of supplying large ranges of currents at low noise. A measurement circuit 305 is coupled to input terminals 301 and 302 for measuring the response of head 303, as biased by $I_{HEAD}$ and excited by the magnetic field applied by magnetic field generating apparatus 200 (shown in FIG. 2). Measurement circuit 305 has a measurement output 306.

In one embodiment, a control circuit 310 controls the sequence of tests performed on each recording head 303 through control outputs 311 and 312 while measuring the resulting head response on input 313. Control output 311 is coupled to a current control input 314 of current source 304 for controlling the level of bias current, $I_{HEAD}$, applied to recording head 303 through input terminals 301 and 302. The control signal applied to current control input 314 can include a reference voltage or current, for example. In an alternative embodiment, current source 304 is a fixed, not adjustable current source. Output 311 is coupled to magnetic field generating apparatus 200 (shown in FIG. 2) for controlling the magnetic field applied to recording head 303. Input 313 is coupled to measurement output 306 for receiving a measure of the head response for each level of applied magnetic field.

For each level of applied magnetic field, control circuit 310 stores the measured head response in memory 316 or supplies the measured head response to user interface 318. The stored response data, when plotted as a function of magnetic field, forms a transfer curve for the respective recording head 303 under test as the magnetic field is varied from some negative value to some positive value. Typical characteristics that can be measured from the stored transfer curve data include read signal amplitude at maximum field, noise with zero field, noise with applied field, linearity over some range of field, and symmetry. Symmetry is a comparison of the read signal amplitude with a maximum positive field and the read signal amplitude with a maximum negative field. Control circuit 310 can be implemented with a discrete analog control circuit, a discrete digital control circuit or state machine, or a programmed computer such as a microcontroller, for example. Other types of control circuits can also be used.

For a magneto-resistive type of head, the head response consists of a steady state voltage on tester inputs 301 and 302, which is a function of the reference bias current $I_{HEAD}$ applied to recording head 303, the bulk resistance of the head and the magnetic field applied by the apparatus shown in FIG. 2. As described in more detail below, measurement circuit 305 quickly measures changes in the voltage developed across recording head 303 while drawing a very low input bias current, introducing a very low noise level into the measurement, and isolating the recording head from potentially harmful capacitances within the measurement circuit.

Measurement circuit 300 includes input stages 320 and 322, AC-coupling capacitors 324 and 326, analog switches 328 and 330, bias resistors 332 and 334 and differential amplifier 336. Input stages 320 and 322 have inputs coupled to input terminals 301 and 302, respectively, and outputs coupled to capacitors 324 and 326, respectively. Each input stage 320 and 322 includes at least one buffering amplifier, such as an operational amplifier coupled as a voltage follower. In one embodiment, the buffering amplifiers have unity gain, but can apply other gain factors in alternative embodiments. A variety of common operational amplifiers can be used, such as LT1128 operational amplifiers available from Linear Technology Corporation, which draw input bias currents on the nano-Ampere level.

The use of buffering amplifiers in input stages 320 and 322 therefore provides low input bias currents to input terminals 301 and 302, which are significantly lower than the current that is used to bias recording head 303. This allows for greater accuracy in the measured voltage across terminals 301 and 302. Input stages 320 and 322 also protect head 303 from any stray charges that might be present on capacitors 324 and 326 as successive heads 303 are inserted and removed from the test socket. As recording heads continue to become smaller, these heads can be damaged more easily by such stray charges. Another function of input stages 320 and 322 is to isolate input terminals 301 and 302 from differential amplifier 336 so that the amplifier will not alter the operating point of the recording head 303 under test. In addition, input stages 320 and 322 provide a strong drive current to quickly charge and discharge capacitors 324 and 326 and thus the inputs to differential amplifier 336 when the DC operating point of head 303 is changed. This quickens the settling time at measurement output 306. Even higher drive and lower noise can be achieved by coupling multiple operational amplifiers in parallel with one another within each input stage 320 and 322.

Capacitors 324 and 326 are coupled between input stages 320 and 322 and inputs 340 and 342 of differential amplifier 336 to block any DC voltage component of the head response from reaching the amplifier inputs. Bias resistors 332 and 334 are coupled between respective amplifier input terminals 340 and 342 and ground terminal GND for biasing each input of amplifier 336. Differential amplifier 336 has an amplifier output 348, which is coupled to measurement output 306 of measurement circuit 305. Capacitors 324 and 326 and bias resistors 332 and 334 together form a high-pass filter. The capacitances of AC coupling capacitors 324 and 326 and the resistances of resistors 332 and 334 are selected to achieve a desired high-pass corner frequency for the filter as well as a desired noise level introduced by the filter. The high-pass corner frequency is determined by $1/(2\pi RC)$, where R is the resistance of resistors 332 and 334 and C is the capacitance of AC coupling capacitors 324 and 326. In a typical transfer curve tester, this corner frequency is often less than 1 Hz. In order to prevent noise introduced by biasing resistors 332 and 334 from affecting the composite noise of the filter, resistors 332 and 334 are made as small as possible and the AC coupling capacitors 324 and 326 are made as large as possible. With the drive that is available from input stages 320 and 322, resistances of less than 100 ohms can easily be used. The large AC coupling capacitors provide a low impedance path through input stages 320 and 322 to shunt the resistor noise to ground.

Differential amplifier 336 can include any discrete or commercial differential amplifier that meets the desired noise and bandwidth requirements. For example, a suitable commercial instrumentation amplifier having low noise (1 nV/√Hz) and high gain is the SSM2017 amplifier, which is available from Analog Devices. For low noise at lower gains, an instrumentation amplifier made from multiple operational amplifiers such as the LT1128 or AD797 can be used. The AD797 is also available from Analog Devices. For extremely low noise (less than 0.5 nV/√Hz), multiple operational or instrumentation amplifiers can be coupled together in parallel with one another.

The settling time of amplifier 336 to a change in the input DC levels at input terminals 301 and 302 is determined by the RC time constant of the filter formed by AC coupling capacitors 324 and 326 and bias resistors 332 and 334. This settling time can be very long, which can impact the time required to fully test each head 303 if there are a large number of measurement levels for each head. To circumvent this problem, analog switches 328 and 330 are coupled in parallel across bias resistors 332 and 334, respectively. Switches 328 and 330 have switch control inputs 344 and 346, which are coupled to and controlled by control circuit 310. When control circuit 310 changes the head bias current $I_{HEAD}$ through current control input 314, control circuit 310 closes switches 328 and 330 through switch control inputs 344 and 346 for a time sufficient for capacitors 324 and 326 to fully charge. When switches 328 and 330 are closed, the RC time constant is reduced by several orders of magnitude, allowing the differential amplifier 336 to settle quickly to the new DC operating point. Control circuit 310 then opens switches 328 and 330 and records the response on measurement output 306 in memory 316.

Figure 4:
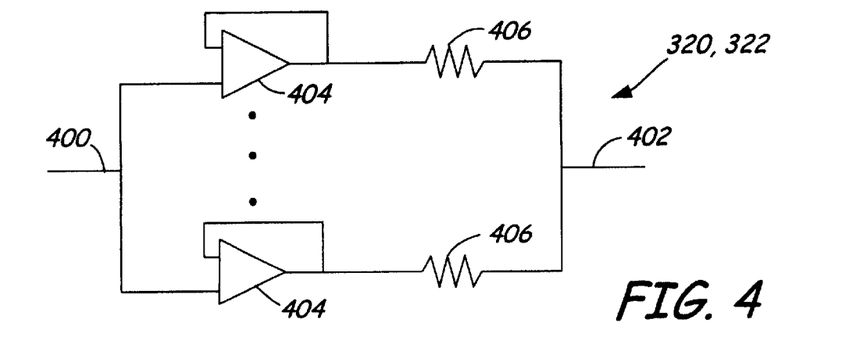
FIG. 4 is a diagram of an input stage used in the tester shown in FIG. 3, according to one embodiment of the present invention.

FIG. 4 is a diagram illustrating one of the input stages 320 and 322 in greater detail. Each input stage 320 and 322 includes an input 400, an output 402 and a plurality of buffer amplifiers 404, which are coupled in parallel with one another. Each buffer amplifier 404 is coupled to operate as a voltage follower. The output of each amplifier 404 is coupled to buffer output 402 through a respective summing resistor 406. Input stages 320 and 322 can also be designed to provide gain from buffer input 400 to buffer output 402 or can be simple buffers with unity gain as shown in FIG. 4. By coupling a plurality of amplifiers 404 in parallel with one another, an input stage having a low noise level, such as less than 0.5 nV/√Hz, an input bias current in the nano-amp range and a moderately large drive current can be realized.

The input bias current drawn through buffer input 400 and the current driven through buffer output 402 go up in proportion to the number of devices used, i.e.:

Total $I_{BIAS}=N*I_{BIAS}$ of each device; and

Total $I_{OUT}=N*I_{OUT}$ of each device where N is the number of parallel-connected amplifiers in each stage.

Conversely, the noise of input stages 320 and 322 go down by the square root of the number of devices used, i.e.:

$$V_{NOISE\ TOTAL}=[V_{NOISE\ OF\ EACH\ DEVICE}]/\sqrt{N}$$

Figure 5:
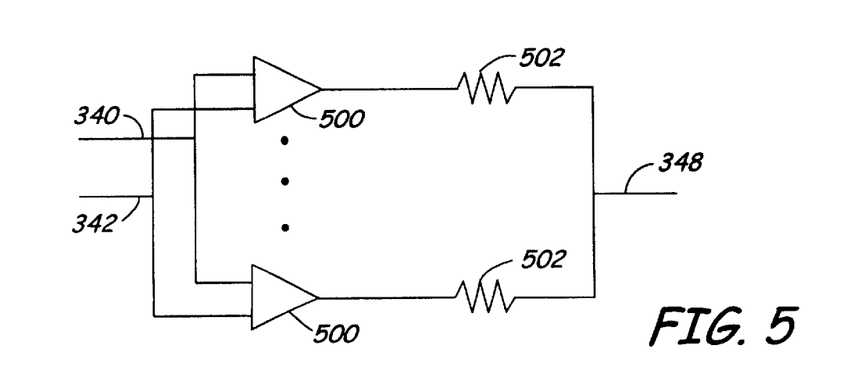
FIG. 5 is a diagram of a differential amplifier stage used in the tester shown in FIG. 3, according to one embodiment of the present invention.

FIG. 5 is a diagram illustrating differential amplifier 336 in greater detail according to one embodiment of the present invention. Amplifier 336 includes a plurality of individual amplifiers 500 coupled in parallel with one another. Summing resistors 502 are coupled in series between the outputs of respective amplifiers 500 and differential amplifier output 348. Again, the use of multiple operational or instrumentation amplifiers in parallel with one another can provide for extremely low noise (less than 0.5 nV/√Hz) within differential amplifier 336.

Figure 6:
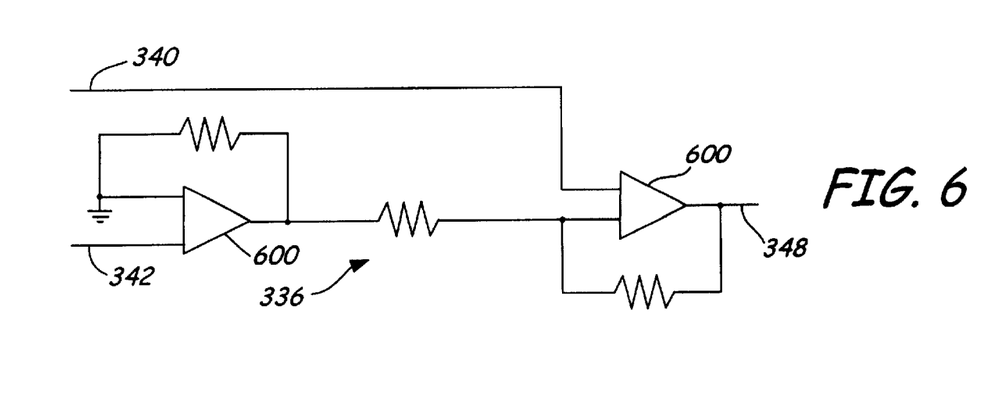
FIG. 6 is a diagram of a differential amplifier stage according to an alternative embodiment of the present invention.

FIG. 6 is a diagram illustrating differential amplifier 336 in greater detail according to an alternative embodiment of the present invention, which uses multiple operational amplifiers 600 for providing low noise at a lower gain. The same reference numerals are used in FIG. 6 as were used in FIG. 3 for the same or similar elements. Other types of differential amplifier circuits can also be used in accordance with the present invention.

Figure 7:
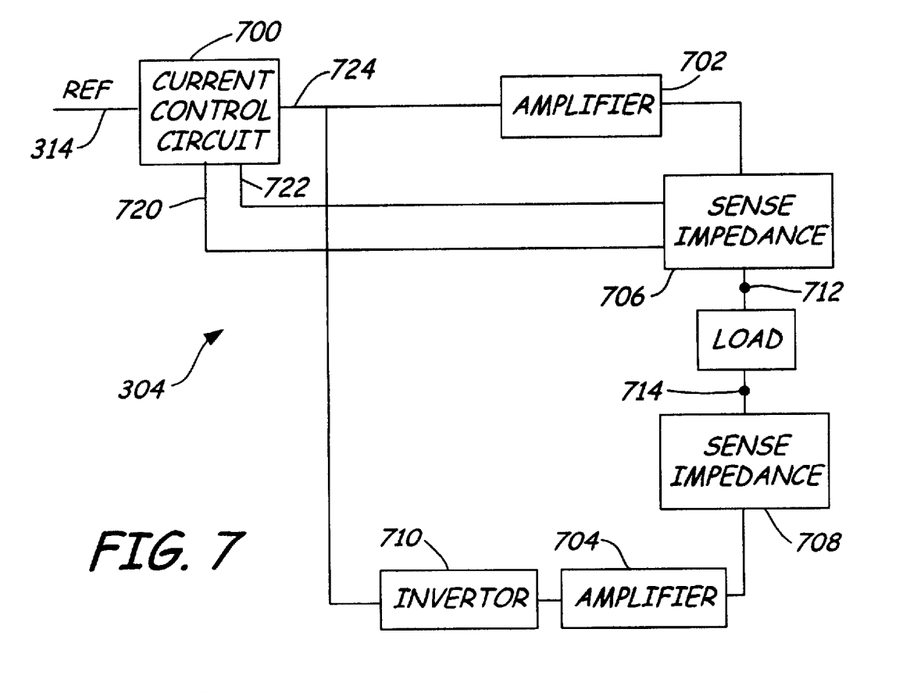
FIG. 7 is a diagram of the balanced, bi-directional current source shown in FIG. 3, according to one alternative embodiment of the present invention.

FIG. 7 is a block diagram which illustrates current source 304 in greater detail according to one embodiment of the present invention. Current source 304 is a balance, bi-directional current source that includes current control circuit 700, amplifiers 702 and 704, sense impedances 706 and 708, analog voltage inverter 710 and current output terminals 712 and 714. Current control circuit 700 includes current control input 314, feedback inputs 720 and 722 and control output 724. Current control circuit 700 generates a control voltage on control output 724 based on the voltage received on current control input 314 from control circuit 303 (shown in FIG. 3) and a voltage developed across feedback inputs 720 and 722. The control voltage on control output 724 is coupled to the input of amplifier 702 and to the input of analog voltage inverter 710. Analog voltage inverter 710 inverts the control voltage on control output 724 and provides the inverted control voltage to the input of amplifier 704. In an alternative embodiment, analog voltage inverter 710 is removed, and amplifier 704 is replaced with an inverting amplifier.

Amplifiers 702 and 704 can include operational amplifiers or class A/B bi-polar amplifiers, for example. Other types of amplifiers can also be used. In one embodiment, amplifiers 702 and 704 have unity gain, but can have other gain values in alternative embodiments. To provide a balanced, bi-directional current to current output terminals 712 and 714, amplifiers 702 and 704 are matched to one another, with each amplifier having the same input bias current, the same output drive current and the same gain from input to output.

The outputs of amplifiers 702 and 704 are coupled to sense impedances 706 and 708. Sense impedance 706 is coupled in series between the output of amplifier 702 and current output terminal 712. Similarly, sense impedance 708 is coupled between the output of amplifier 704 and current output terminal 714. In one embodiment, sense impedances 706 and 708 each include a resistance coupled in series between the respective amplifier output and the respective current output terminal 712 and 714. Sense impedances 706 and 708 are matched to one another to provide a balanced differential output current through current output terminals 712 and 714.

The voltage developed across sense impedance 706 is fed back to feedback inputs 720 and 722 of current control circuit 700. Current control circuit 700 measures the voltage developed across the sense impedance at feedback inputs 720 and 722 and compares this voltage to the reference voltage provided on current control input 314. Based on this comparison, current control circuit 700 adjusts control output 724 such that the desired current level is supplied through current output terminals 712 and 714, as represented by the voltage drop across sense impedance 706.

Figure 8:
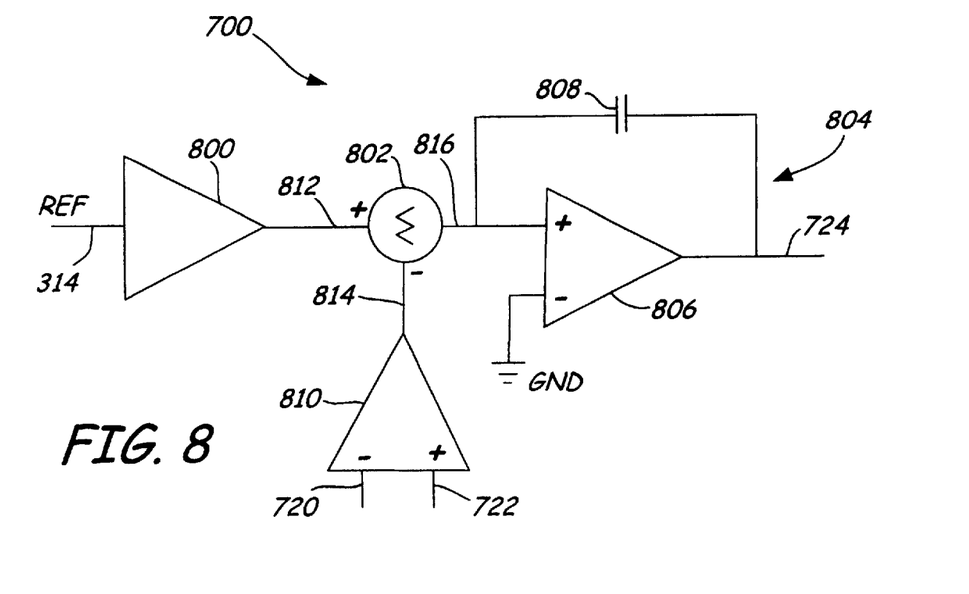
FIG. 8 is a diagram of a current control circuit used in the current source shown in FIG. 7, according to one alternative embodiment of the present invention.

FIG. 8 is a schematic diagram, which illustrates current control circuit 700 in greater detail, according to one embodiment of the present invention. Current control circuit 700 includes buffer and signal conditioning circuit 800, summation node 802, integrator 804, which is formed by amplifier 806 and capacitor 808, and differential amplifier 810. The reference voltage provided on current control input 314 is coupled to an addend input 812 of summation node 802. Feedback inputs 720 and 722 are coupled to respective inputs of differential amplifier 810. The output of differential amplifier 810 is coupled to a subtrahend input 814 of summation node 802. The output 816 of summation node 802 is coupled to the non-inverting input of amplifier 806 within integrator 804. The inverting input of amplifier 806 is coupled to ground terminal GND. Capacitor 808 is coupled between the output and the non-inverting input of amplifier 806. The output of amplifier 806 forms control output 724 of current control circuit 700. In operation, summation node 802 compares the reference voltage received on current control input 314 to the voltage measured across sense impedance 706 (shown in FIG. 7) and provides the difference to integrator 804. In response, integrator 806 adjusts the voltage on control output 724.

Current source 304 provides a balanced, differential output current with a large voltage output using off-the-shelf operational amplifiers. A balanced differential output, while doubling the available current for driving high-resistance recording heads, also assures that the measurement system has low noise by providing true "4-point" measurement capability.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the current source and measurement circuit can be used together or independently in applications other than testing recording heads. The current source can be used in any application in which a bi-directional current source is useful. The measurement circuit can be used in any application requiring or benefiting from a low input bias current, low noise and high accuracy. Also, individual components can be implemented with analog circuit elements, digital circuit elements or a combination of both.

What is claimed is:

1. A balanced bi-directional current source comprising:

first and second current output terminals;

a current control circuit comprising a reference input, a feedback input, and a control output, which is based on the reference input and the feedback input;

a first amplifier having a first amplifier input, which is coupled to the control output, and a first amplified output;

a second amplifier having a second amplifier input, which is coupled to the control output, and a second amplified output, which is inverted relative to the first amplified output;

a first sense impedance coupled between the first amplified output and the first current output terminal and having a feedback output which is coupled to the feedback input; and a second sense impedance that is matched with the first impedance and is coupled between the second amplified output and the second current output terminal.

2. The balanced bi-directional current source of claim 1 wherein:

the first and second amplifiers each comprises an amplifier that is coupled to operate as a voltage follower.

3. The balanced bi-directional current source of claim 1 wherein the second amplifier comprises an inverting amplifier.

4. The balanced bi-directional current source of claim 1 wherein the second amplifier comprises a non-inverting amplifier coupled in series with an analog voltage inverter.

5. The balanced bi-directional current source of claim 1 wherein the first and second amplifiers have matched input bias currents and matched gains, but with the second amplified output being inverted relative to the first amplified output.

6. The balanced bi-directional current source of claim 1 wherein:

the feedback input comprises first and second feedback inputs; and the first sense impedance comprises first and second impedance terminals coupled to the first and second feedback inputs, respectively.

7. The balanced bi-directional current source of claim 6 wherein the current control circuit further comprises:

a summing node having an addend input, which is coupled to the reference input, a subtrahend input and a sum output;

a differential amplifier having first and second differential amplifier inputs coupled to the first and second feedback inputs, respectively, and a differential amplifier output coupled to the subtrahend input; and an integrator coupled between the sum output and the control output.

8. A balanced bi-directional current source comprising:

first and second current output terminals;

current control means for generating a control output based on a reference input and a feedback input;

means for generating first and second amplified drive currents based on the control output and delivering the first and second amplified drive currents to the first and second output terminals, respectively, through first and second matched sense impedances, respectively, wherein the second amplified drive current is inverted with respect to the first amplified drive current; and means for feeding a voltage developed across the first sense impedance in response to the first amplified drive current back to the feedback input.

9. The balanced bi-directional current source of claim 8 wherein:

the means for generating first and second amplified drive currents comprises first and second amplifiers coupled to the control output as voltage followers.

10. The balanced bi-directional current source of claim 9 wherein the second amplifier comprises an inverting amplifier.

11. The balanced bi-directional current source of claim 9 wherein the second amplifier comprises a non-inverting amplifier coupled in series with an analog voltage inverter.

12. The balanced bi-directional current source of claim 9 wherein the means for generating first and second amplified drive currents comprises first and second amplifiers coupled to the control output and having matched input bias currents and matched gains, but with the second amplified drive current being inverted relative to the first amplified drive current.

13. The balanced bi-directional current source of claim 9 wherein:

the feedback input comprises first and second feedback inputs; and the first sense impedance comprises first and second impedance terminals coupled to the first and second feedback inputs, respectively.

14. The balanced bi-directional current source of claim 13 wherein the current control means comprises:

a summing node having an addend input, which is coupled to the reference input, a subtrahend input and a sum output;

a differential amplifier having first and second differential amplifier inputs coupled to the first and second feedback inputs, respectively, and a differential amplifier output coupled to the subtrahend input; and an integrator coupled between the sum output and the control output.

* * * * *